US012713634B2

(12) United States Patent
Philippou et al.

(10) Patent No.: US 12,713,634 B2
(45) Date of Patent: Aug. 18, 2026

(54) SEMICONDUCTOR DEVICE INCLUDING TRENCH TRANSISTOR CELL UNITS

(71) Applicant: Infineon Technologies AG, Neubiberg (DE)

(72) Inventors: Alexander Philippou, Munich (DE); Roman Baburske, Otterfing (DE); Frank Pfirsch, Munich (DE); Franz Josef Niedernostheide, Hagen a.T.W. (DE)

(73) Assignee: Infineon Technologies AG, Neubiberg (DE)

( * ) Notice: Subject to any disclaimer, the term of this patent is extended or adjusted under 35 U.S.C. 154(b) by 371 days.

(21) Appl. No.: 18/583,993

(22) Filed: Feb. 22, 2024

(65) Prior Publication Data

US 2024/0304709 A1 Sep. 12, 2024

(30) Foreign Application Priority Data

Mar. 7, 2023 (DE) ......................... 102023202032.7

(51) Int. Cl.

| | |
|---|---|
| ***H01L 29/739*** | (2006.01) |
| ***H10D 12/00*** | (2025.01) |
| ***H10D 12/01*** | (2025.01) |
| ***H10D 62/10*** | (2025.01) |
| ***H10D 64/60*** | (2025.01) |
| ***H10D 89/10*** | (2025.01) |

(52) U.S. Cl.

CPC ......... *H10D 12/481* (2025.01); *H10D 12/032* (2025.01); *H10D 62/10* (2025.01); *H10D 64/605* (2025.01); *H10D 89/10* (2025.01)

(58) Field of Classification Search

CPC .... H10D 12/481; H10D 64/605; H10D 62/10; H10D 89/10; H10D 12/032

See application file for complete search history.

(56) References Cited

U.S. PATENT DOCUMENTS

2019/0074367 A1* 3/2019 Naito ..................... H10D 8/045

FOREIGN PATENT DOCUMENTS

| | | | |
|---|---|---|---|
| DE | 102016107311 | B3 | 8/2017 |
| DE | 102016111449 | A1 | 12/2017 |
| JP | 2008305956 | A | 12/2008 |

* cited by examiner

*Primary Examiner* — William C Trapanese

(74) *Attorney, Agent, or Firm* — Murphy, Bilak & Homiller, PLLC

(57) ABSTRACT

A semiconductor device includes a semiconductor body having a trench transistor cell array. The trench transistor cell array includes a first trench transistor cell unit and a second trench transistor cell unit. Transistor cells based on the first trench transistor cell unit and transistor cells based on the second trench transistor cell unit are electrically connected in parallel. The first trench transistor cell unit has a first threshold voltage. The second trench transistor cell unit has a second threshold voltage larger than the first threshold voltage. An absolute value of dU/dt at turning on a nominal current of the transistor cell array is at least 50% of an absolute value of dU/dt at turning on 10% of the nominal current of the transistor cell array, dU/dt being the temporal derivate of a voltage U between load terminals of the trench transistor cell array.

21 Claims, 9 Drawing Sheets

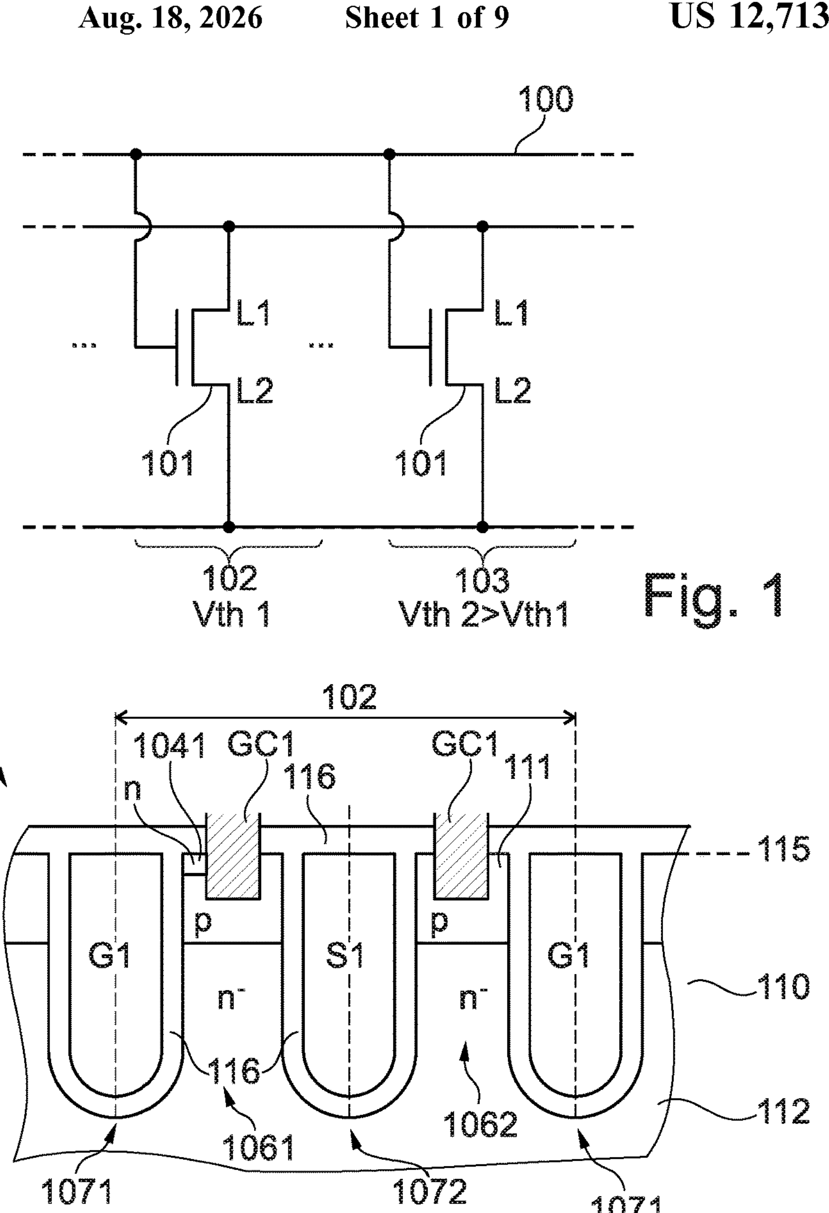
Fig. 1
Fig. 2A
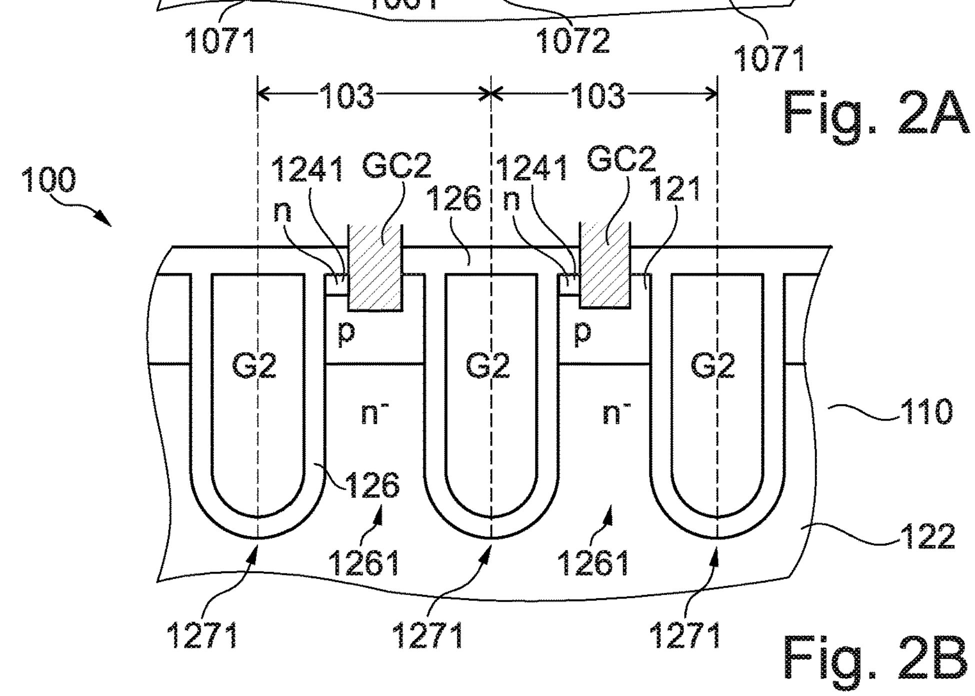
Fig. 2B

Figures 9, 10:
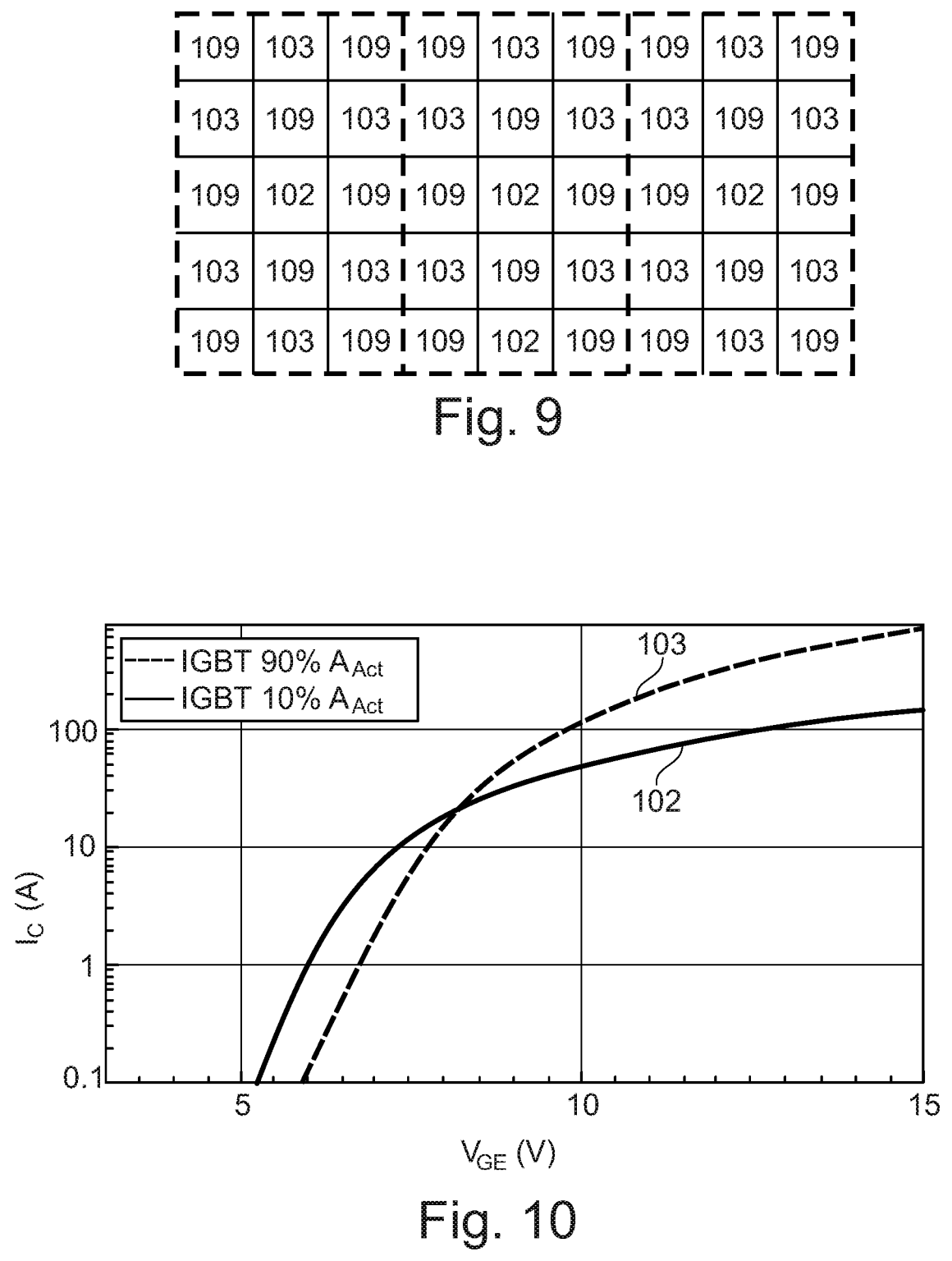

| 109 | 103 | 109 | 109 | 103 | 109 | 109 | 103 | 109 |
|---|---|---|---|---|---|---|---|---|
| 103 | 109 | 103 | 103 | 109 | 103 | 103 | 109 | 103 |
| 109 | 102 | 109 | 109 | 102 | 109 | 109 | 102 | 109 |
| 103 | 109 | 103 | 103 | 109 | 103 | 103 | 109 | 103 |
| 109 | 103 | 109 | 109 | 102 | 109 | 109 | 103 | 109 |

SEMICONDUCTOR DEVICE INCLUDING TRENCH TRANSISTOR CELL UNITS

TECHNICAL FIELD

The present disclosure is related to a semiconductor device, in particular to a semiconductor device including trench transistor cell units.

BACKGROUND

Technology development of new generations of semiconductor devices, e.g. Insulated Gate Bipolar Transistors (IGBTs) or Metal Oxide Semiconductor Field Effect Transistors (MOSFETs), aims at improving electric device characteristics and reducing costs by shrinking device geometries. Although costs may be reduced by shrinking device geometries, a variety of tradeoffs and challenges have to be met when increasing device functionalities per unit area. For example, a trade-off between area-specific on-state resistance, $R_{on}\times A$ and turn-on efficiency requires design optimization.

Thus, there is a need for an improved semiconductor device.

SUMMARY

An example of the present disclosure relates to a semiconductor device. The semiconductor device includes a semiconductor body comprising a trench transistor cell array. The trench transistor cell array includes a first trench transistor cell unit, and a second trench transistor cell unit. Transistor cells based on the first trench transistor cell unit and transistor cells based on the second trench transistor cell unit are electrically connected in parallel. The first trench transistor cell unit has a first threshold voltage. The second trench transistor cell unit has a second threshold voltage larger than the first threshold voltage. An absolute value of dU/dt at turning on a nominal current of the transistor cell array is at least 50% of an absolute value of dU/dt at turning on 10 percent of the nominal current of the transistor cell array, dU/dt being the temporal derivate of a voltage U between load terminals of the trench transistor cell array.

Another example of the present disclosure relates to a method for manufacturing a semiconductor device. The method includes forming a trench transistor cell array in a semiconductor body. The trench transistor cell array includes a first trench transistor cell unit, and a second trench transistor cell unit. Transistor cells based on the first trench transistor cell unit and transistor cells based on the second trench transistor cell unit are electrically connected in parallel. The first trench transistor cell unit has a first threshold voltage. The second trench transistor cell unit has a second threshold voltage larger than the first threshold voltage. An absolute value of dU/dt at turning on a nominal current of the transistor cell array is at least 50% of an absolute value of dU/dt at turning on 10% of the nominal current of the transistor cell array, dU/dt being the temporal derivate of a voltage U between load terminals of the trench transistor cell array.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of semiconductor devices and together with the description serve to explain principles of the examples. Further examples are described in the following detailed description and the claims.

FIG. 1 is a schematic view of a semiconductor device including a trench transistor cell array including first and second trench transistor cell units having different threshold voltages.

FIGS. 2A, 2B and 2C are partial cross-sectional views for illustrating examples of first and second trench transistor cell units.

FIG. 9 is a schematic top view for illustrating an example of a transistor cell array including first, second and third trench transistor cell units having different threshold voltages.

FIG. 10 is a schematic graph for illustrating collector currents at different gate-to-emitter voltages for the first and second trench transistor cell units.

DETAILED DESCRIPTION

Figure 2C:
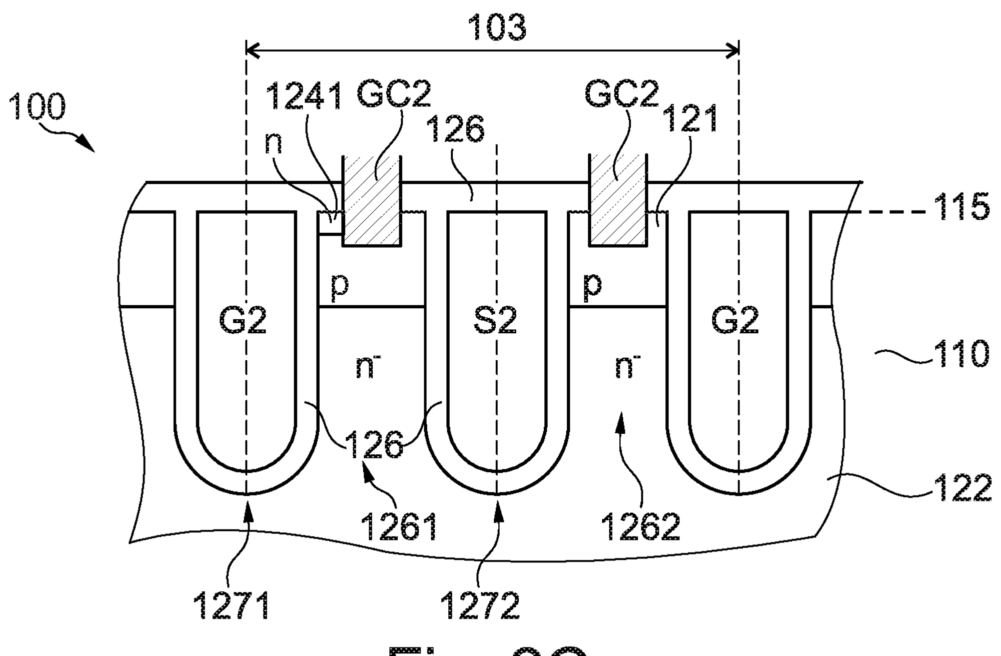

In the following detailed description, reference is made to the accompanying drawings, which form a part hereof and in which are shown by way of illustrations specific examples of semiconductor devices including trench transistor cell units. It is to be understood that other examples may be utilized and structural or logical changes may be made without departing from the scope of the present disclosure. For example, features illustrated or described for one example can be used in conjunction with other examples to yield yet a further example. Aspects and examples of the present disclosure may be combined, for example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as a≤y≤b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of a semiconductor device may include a semiconductor body comprising a trench transistor cell array. The trench transistor cell array includes a first trench transistor cell unit, and a second trench transistor cell unit. Transistor cells based on the first trench transistor cell unit and transistor cells based on the second trench transistor cell unit are electrically connected in parallel. The first trench transistor cell unit may have a first threshold voltage. The second trench transistor cell unit may have a second threshold voltage larger than the first threshold voltage.

According to an aspect of the present disclosure, the first trench transistor cell unit may differ from the second trench transistor cell unit by a structural feature configured to reduce dependency of an absolute value of dU/dt from a turn-on current of the transistor cell array, dU/dt being the temporal derivate of a voltage U between load terminals of the trench transistor cell array.

According to an aspect of the present disclosure, an absolute value of dU/dt at turning on a nominal current of the transistor cell array may be at least 50%, or at least 65%, or at least 70%, or at least 80%, or at least 90%, of an absolute value of dU/dt at turning on 10% of the nominal current of the transistor cell array, dU/dt being the temporal derivate of a voltage U between load terminals of the trench transistor cell array. The dU/dt may refer to a time period $\Delta t$ associated with a voltage range $\Delta U$, $\Delta U$ being the voltage range between 10% and 90% of a peak voltage, or between 20% and 80% of the peak voltage, or between 30% and 70% of the peak voltage during the turn-on process.

The semiconductor device may be an IGBT, or an insulated gate field effect transistor (IGFET) such as a MOSFET, for example. The semiconductor device may be part of an integrated circuit or may be a discrete semiconductor device or a semiconductor module, for example. The semiconductor device may be a power IGBT or MOSFET, e.g. a vertical power IGBT or MOSFET having a load current flow between a first surface and a second surface opposite to the first surface. The power IGBT or MOSFET may be configured to conduct currents of more than 1 A or more than 10 A or more than 30 A or more than 50 A or more than 75 A or even more than 100 A, and may be further configured to block voltages between load terminals or electrodes, e.g. between collector and emitter or between drain and source, in the range of several hundreds of up to several thousands of volts, e.g. 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the semiconductor device, for example. For realizing a desired current carrying capacity, the semiconductor device may be designed by a plurality of parallel-connected transistor cells. The parallel-connected transistor cells may, for example, be IGBT or MOSFET cells formed in the shape of a strip or a strip segment. Of course, the transistor cells can also have any other shape, e.g., circular, elliptical, polygonal such as octahedral. Parallel connection of transistor cells may be achieved by electrically connecting second load terminals or electrodes of the transistor cells, e.g. emitter of IGBT cells or source of MOSFET cells, to one another, e.g. via a wiring area over the first surface of the semiconductor body. Likewise, first load terminals or electrodes of the transistor cells, e.g. collector of IGBT cells or drain of a MOSFET cells, may be electrically connected to one another, e.g. via a wiring area over the second surface of the semiconductor body.

The semiconductor body may include or consist of a semiconductor substrate. A material of the semiconductor body may be from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

The first surface may be a front surface or a top surface of the semiconductor body, and the second surface may be a back surface or a rear surface of the semiconductor body, for ex-ample. The semiconductor body may be attached to a lead frame via the second surface, for example. Over the first surface of the semiconductor body, bond pads may be arranged and bond wires may be bonded on the bond pads, for example.

The emitter or source terminal or electrode as the second load terminal may be part of a wiring area over the semiconductor body. The wiring area may include one or more than one, e.g. two, three, four or even more wiring levels. Each wiring level may be formed by a single one or a stack of conductive layers, e.g. metal layer(s) or highly doped semiconductor layer(s) such as highly doped polycrystalline silicon layers(s). The wiring levels may be lithographically patterned, for example. Between stacked wiring levels, an interlayer dielectric structure may be arranged. The interlayer dielectric structure may include one or more than one, e.g. stacked, dielectric layer(s), e.g. silicate glass layers such as borophosphosilicate glass (BPSG), borosilicate glass (BSG), phosphosilicate glass (PSG), undoped silicate glass (USG), oxide, e.g., $SiO_2$, nitride, e.g., $Si_3N_4$, high-k dielectric, or low-k dielectric, or any combination thereof. Contact plug(s) or contact line(s) may be formed in openings in the interlayer dielectric structure to electrically connect parts, e.g. metal lines or contact areas, of different wiring levels to one another. The source or emitter electrode or terminal may be formed by one or more elements of the wiring area over the first surface. Likewise, the drain or collector electrode or terminal may be formed by one or more elements of the wiring area over the second surface.

The trench transistor cell array may be formed in an active area of the semiconductor body. The active area may be an area where an emitter region of an IGBT or a source region of a MOSFET at the first surface and a collector region of an IGBT at the second surface or a drain region of a MOSFET are arranged opposite to one another along a vertical direction. In the active area, an IGBT or MOSFET load current may enter or exit the semiconductor body of the IGBT, e.g. via contact plugs on the first surface of the semiconductor body.

The transistor cell unit may refer to a small or smallest functional part of the transistor cell array. The semiconductor device may include transistor cell units differing from one another, e.g. the second transistor cell unit may have a larger threshold voltage than the first transistor cell unit. The transistor cell array refers to a parallel connection of multiple transistor cell units. For example, a transistor cell unit may have a polygonal, for example rectangular, square, hexagonal, octagonal, circular or elliptic shape. The shape refers to a projection of an overall dimension of the transistor cell unit to a main surface of the semiconductor body, for example the first or front surface of the semiconductor body. In other words, the shape refers to an overall dimension when viewing the overall dimension of the transistor cell unit along a direction perpendicular to the main or first surface, for example a top view. In a cross-sectional view of a transistor cell unit, the transistor cell unit may include at least one trench having a gate electrode. The transistor cell unit may also include more than one, e.g. two, three, four or even more trenches that are laterally spaced by mesa regions arranged between neighboring trenches of the trench transistor cell unit. Electrodes in the trenches of some or all of the trenches of the transistor cell unit may differ from one another by an electric connection of the electrode formed in the trenches. One or more electrodes in the trenches may be gate electrodes electrically connected to a gate terminal or pad, for example. None, one or more electrodes in the trenches of the transistor cell unit may be electrically connected to a terminal that differs from the gate terminal, e.g. a load terminal such as a source or emitter terminal, or a reference voltage supplied by an internal or external circuit. None, one or more electrodes in the trenches of the transistor cell unit may be electrically floating, for example. An electric contact scheme of mesa regions of the first and second trench transistor cell units may also differ from another, e.g. for adjusting a feedback capacitance of the transistor cell units to one another.

The first and second transistor cell units may have a same or different number of trenches that are laterally spaced by intervening mesa regions, for example.

The threshold voltage of the second transistor cell unit may be set larger than the threshold voltage of the first transistor cell unit by one or more structural modifications in the second transistor cell unit compared with the first transistor cell unit. For example, for setting the threshold voltage in the second transistor cell unit larger than the threshold voltage in the first transistor cell unit, the second transistor cell unit may differ from the first transistor cell unit by at least one of a gate dielectric material, a gate dielectric thickness, a gate electrode material, a channel region doping concentration.

The sub-division of the trench transistor cell array into at least the first trench transistor cell unit and the second trench transistor cell unit may allow for improving the turn-on behavior of the semiconductor device. For example, for small load currents, only the first transistor cell units may be active during the turn-on process, and may conduct most of the current, while for larger currents also the second transistor cell units may conduct a large amount of the current. This may allow for a rather independent dU/dt and dI/dt of the turn-on current, and may enable speeding up of the semiconductor device at nominal currents.

According to the present disclosure, a first internal gate resistor may be connected in series between a gate electrode of the first trench transistor cell unit and a gate pad. A second internal gate resistor may be connected in series between the gate electrode of the second trench transistor cell unit and the same gate pad. The first internal gate resistor may be smaller than the second internal gate resistor. In addition or as an alternative, a product of the first internal gate resistor and the gate capacitance of the first trench transistor cells connected thereto (Rint1×Cg1) may be smaller than the product of the second internal gate resistor and the gate capacitance of the second trench transistor cells connected thereto (Rint2×Cg2). This may allow for increasing a turn-on speed of the first transistor cell unit compared with the second transistor cell unit, for example. For example, the first and/or second internal gate resistor may be electrically connected between the gate pad and a gate runner or may be electrically connected between the gate runner and the gate electrode, for example. The first and/or second internal gate resistor may be formed as a part of the wiring area over the first surface, for example. As an alternative or in addition, the first and/or second internal gate resistor may be formed in the semiconductor body, e.g. as a diffusion resistor and/or as part of a resistor material filled into a trench. The first internal gate resistor (or the Rint1×Cg1) may also be set smaller than the second gate resistor (or the Rint2×Cg2) by at least one of a different number of parallel-connected trenches filled with resistor material, a different length of trenches filled with resistor material, or a different width/length ratio of planar resistors, for example.

According to the present disclosure, the first internal gate resistor and the second internal gate resistor may include doped polycrystalline silicon. A cross section of the first internal gate resistor may be larger than a cross section of the second internal gate resistor. For example, the first and/or second internal gate resistors may be formed as an extension of trench electrodes in the trenches of the first and/or second trench transistor cell units toward a gate runner, for example.

According to the present disclosure, a share of a source or emitter region within the first trench transistor cell unit may be smaller than a share of a source or emitter region within the second trench transistor cell unit. The share may refer to a ratio of surface area of the source or emitter region and a surface area, e.g. an active area, of the transistor cell unit at the first surface.

According to the present disclosure, at least the first trench transistor cell unit may include a first mesa region and a second mesa region. The source or emitter region may be arranged in the first mesa region and may be omitted from the second mesa region. For example, a ratio of first mesa regions to second mesa regions may be greater in the first trench transistor cell unit than in the second trench transistor cell unit.

According to the present disclosure, at least the first trench transistor cell unit may include a first mesa region and a second mesa region. The second mesa region may be laterally confined by trench electrode structures having a trench electrode that is electrically disconnected from a gate electrode. For example, the trench electrode may be electrically connected to a source or emitter terminal or electrode, or may be electrically floating, or may be electrically connected to a reference voltage that may be supplied by an internal or external voltage supply, for example.

According to the present disclosure, the second mesa region may be electrically connected to a source or emitter electrode or terminal over the second mesa region. For example, the second mesa region may be electrically connected to the source or emitter electrode or terminal via a contact plug extending through an interlayer dielectric on the first surface of the semiconductor body, for example. By varying the contact scheme of the first transistor cell unit comparted with the second trench transistor cell unit, a feedback capacitance of the first trench transistor cell unit may be larger than of the second trench transistor cell unit, for example.

According to the present disclosure, the trench electrode structures may be electrically connected to a source or emitter electrode or terminal.

According to the present disclosure, a gate electrode of the first trench transistor cell unit may have a larger cell unit active area share than a gate electrode of the second trench transistor cell unit. For example, a number of trenches including a trench electrode different from a gate electrode may be larger in the first trench transistor cell unit than in the second trench transistor cell unit.

According to the present disclosure, the first trench transistor cell unit may include a first barrier region having a first conductivity type different from a second conductivity type. The first barrier region may be arranged between a drift region of the second conductivity type and a body region of the first conductivity type. The second trench transistor cell unit may also include a first barrier region having the first conductivity type. The first barrier region in the first trench transistor cell unit and the first barrier region in the second trench transistor cell unit may differ from one another with respect to a maximum doping concentration of the first barrier region. For example, the first barrier region in the first trench transistor cell unit may have a larger maximum doping concentration than the first barrier region in the second trench transistor cell unit. For example, the first barrier region may be electrically floating or may have a high-ohmic electric coupling to the body region. For example, a maximum doping concentration of the first barrier region may be smaller than a maximum doping concentration of the body region.

According to the present disclosure, the first barrier region may only be present in the first trench transistor cell unit or may comprise a higher doping concentration than in the second trench transistor cell unit.

According to the present disclosure, the first barrier region may be vertically confined by the drift region and separated from the body region by at least one other semiconductor region. For example, the at least one other semiconductor region and the drift region may be similar with respect to a doping concentration and/or a doping material. For example, the at least one other semiconductor region semiconductor region and the drift region may be separate parts of an epitaxial layer, for example. For example, at least part of the first barrier region may be formed in a mesa region that is laterally confined by trench electrode structures.

According to the present disclosure, the second trench transistor cell unit may include a second barrier region having a second conductivity type different from a first conductivity type. The second barrier region may be arranged between a body region of the first conductivity type and a drift region of the second conductivity type. The first trench transistor cell unit may also include a second barrier region having the second conductivity type. The second barrier region in the second trench transistor cell unit and the second barrier region in the first trench transistor cell unit may differ from one another with respect to a maximum doping concentration of the second barrier region. For example, the second barrier region in the second trench transistor cell unit may have a larger maximum doping concentration than the second barrier region in the first trench transistor cell unit. For example, a maximum doping concentration of the second barrier region may be larger than a maximum doping concentration of a drift region part that adjoins a bottom side of the second barrier region.

According to the present disclosure, a channel width of the first trench transistor cell unit per area may be smaller than a channel width of the second trench transistor cell unit per area. For example, the channel width per area in the first trench transistor cell unit may be reduced to an extent that allows for reducing a saturation current density in the first trench transistor cell unit compared with the second trench transistor cell unit by a target amount. The term channel width of a transistor cell unit used herein may refer to an extension of a channel along a direction perpendicular to a direction where current flows along the channel in an on-state between source and drain or between emitter and collector. In a top view, the channel width may cover those parts along that direction where an inversion channel can be formed when a gate voltage exceeds the threshold voltage and when a source or emitter region abuts that part of the channel for electrically connecting the channel to the source or emitter terminal. In other words, the channel width may be reduced by interrupting a source or emitter region or by deactivating parts of a channel by other means, for example by increasing a threshold voltage above a level where other parts of the channel turn on, or by increasing a gate dielectric thickness of that part of the channel compared with other parts, or by decreasing a gate dielectric constant of that part of the channel compared with other parts, or by any combination of these measures or other measures of similar effect. Thus, a channel width is measured along a direction different from a direction along which a channel length is measured. The channel length is measured along a direction where current flows along the channel in an on-state between source and drain or between emitter and collector, for example. In case of curved and/or tilted channel sections, the width of the channel may be measured along these curved and/or tilted channel sections. Although the above illustrations refer to an n-channel enhancement (normally-off) IGBT or MOS transistor, where a drain or collector current will only flow when a gate voltage is applied to the gate terminal greater than the threshold voltage level in which conductance takes place, other transistor types such as p-channel enhancement (normally-off) IGBT or MOS transistors may be likewise used and the relations with regard to the threshold voltage refer to absolute values of the threshold voltage. The channel width per area of the first trench transistor cell unit may be adjusted such that a saturation current of the first trench transistor cell units is smaller than 4 times the nominal current, or smaller than 3 times the nominal current, or smaller than 1.5 times the nominal current of the semiconductor device. For example, the channel width per area of the first trench transistor cell unit may be reduced compared to the second trench transistor cell unit to such an extent that the collector current of the transistor array part associated with the first trench transistor cell units equals the collector current of the transistor array part associated with the second trench transistor cell units at a gate-to-emitter voltage of 15 V, for example.

According to the present disclosure, the second trench transistor cell unit may differ from the first trench transistor cell unit by a laterally patterned collector region. This may allow for reducing an injection efficiency at a collector-side of the second trench transistor cell unit compared with the injection efficiency at a collector-side of the first trench transistor cell unit, for example.

According to the present disclosure, the first trench transistor cell unit may have a 5% to 20% share of an active area of the trench transistor cell array. For trench transistor cell arrays having either the first trench transistor cell unit or the second trench transistor cell unit, the second trench transistor cell unit may have an 80% to 95% share of the active area of the trench transistor cell array. For trench transistor cell arrays having other trench transistor cell units than the first trench transistor cell unit or the second trench transistor cell unit, the second trench transistor cell unit may have a share of the active area of the trench transistor cell array that is accordingly smaller than the 80% to 95% share.

According to the present disclosure, the trench transistor cell array may further include a third trench transistor cell unit having a third threshold voltage larger than the second threshold voltage. The third trench transistor cell unit may have a larger share of an active area of the trench transistor cell array than the second transistor cell unit. The second trench transistor cell unit may have a larger share of an active area of the trench transistor cell array than the first transistor cell unit, for example.

According to the present disclosure, wherein the semiconductor device may be an n-channel IGBT, and the pnp transistor gain of the first trench transistor cell unit may be larger than the pnp transistor gain of the second trench transistor cell unit. The pnp transistor gain of the first trench transistor cell unit may be set larger than the pnp transistor gain of the second trench transistor cell unit by one or more of a adjusting a doping concentration or dose in the collector region of the first trench transistor cell unit larger than in the second trench transistor cell unit, adjusting a maximum doping concentration or a dose or a width of a field stop region of the first trench transistor cell unit smaller than in the second trench transistor cell unit.

Details with respect to structure or function or technical benefit of features described above with respect to a FET likewise apply to the exemplary methods described herein. Processing the semiconductor body may comprise one or more optional additional features corresponding to one or more aspects mentioned in connection with the proposed concept or one or more examples described above or below.

An example of the present disclosure relates to a method for manufacturing a field effect transistor, FET. The method may include forming a trench transistor cell array in a semiconductor body. The trench transistor cell array may include a first trench transistor cell unit, and a second trench transistor cell unit. Transistor cells based on the first trench transistor cell unit and transistor cells based on the second trench transistor cell unit may be electrically connected in parallel. The first trench transistor cell unit has a first threshold voltage. The second trench transistor cell unit has a second threshold voltage that may be larger than the first threshold voltage. An absolute value of dU/dt at turning on a nominal current of the transistor cell array may be at least 50%, or at least 65%, or at least 70%, or at least 80%, or at least 90%, of an absolute value of dU/dt at turning on 10% of the nominal current of the transistor cell array, dU/dt being the temporal derivate of a voltage U between load terminals of the trench transistor cell array.

The examples and features described above and below may be combined.

Functional and structural details described with respect to the examples above shall likewise apply to the exemplary examples illustrated in the figures and described further below.

In the following, further examples of field effect transistors, FETs, or insulated gate bipolar transistors, IGBTs, are explained in connection with the accompanying drawings. Functional and structural details described with respect to the examples above shall likewise apply to the exemplary embodiments illustrated in the figures and described further below. In the illustrated examples, the first conductivity is p-type and the second conductivity type is n-type for an n-channel FET or IGBT. However, the first conductivity type may also be n-type and the second conductivity type may be p-type for a p-channel FET or IGBT.

FIG. 1 schematically and exemplarily shows a partial cross-sectional view of a semiconductor device 100, e.g. FET or IGBT.

The semiconductor device 100 includes a trench transistor cell array. The trench transistor cell array includes a first trench transistor cell unit 102, and a second trench transistor cell unit 103. Transistor cells 101 based on the first trench transistor cell unit 102 and transistor cells 101 based on the second trench transistor cell unit 103 are electrically connected in parallel. Parallel connection of the transistor cells 101 based on the first trench transistor cell units 102 and the transistor cells 101 based on the second trench transistor cell units 103 may include an electric connection between first load terminals or electrodes L1, e.g. collector of an IGBT or drain of a FET. Likewise, second load terminals or electrodes L2, e.g. emitter of an IGBT or source of a FET, are electrically connected to one another.

The first trench transistor cell unit 102 has a first threshold voltage Vth1. The second trench transistor cell unit 103 has a second threshold voltage Vth2 larger than the first threshold voltage Vth1. An absolute value of dU/dt at turning on a nominal current of the transistor cell array is at least 50%, or at least 65%, or at least 70%, or at least 80%, or at least 90%, of an absolute value of dU/dt at turning on 10% of the nominal current of the transistor cell array, dU/dt being the temporal derivate of a voltage U between the load terminals L1, L2 of the trench transistor cell array.

The schematic cross-sectional view of FIG. 2A schematically shows a partial cross-sectional view of an exemplary first trench transistor cell unit 102 in a semiconductor body 110 of the semiconductor device 100, and the schematic cross-sectional view of FIG. 2B schematically shows a partial cross-sectional view of an exemplary second trench transistor cell unit 103 in the semiconductor body 110 of the semiconductor device 100.

In the example illustrated in FIG. 2A, the first transistor cell unit 102 is based on a first trench 1071, a second trench 1072, as well as a first mesa region 1061 and a second mesa region 1062. An n-doped source or emitter region 1041 is arranged in the first mesa region 1061 and is omitted from the second mesa region 1062. The first trench 1071 includes a gate electrode G1 that is electrically coupled to a gate pad. The second trench 1072 includes a source electrode S1 that is electrically coupled to the second load terminal L1, e.g. the source or emitter terminal or electrode. Each of the mesa regions 1061, 1062 is electrically coupled to a groove contact GC1 in a wiring area over a first surface 115 the semiconductor body 110. The groove contact GC1 provides electric contact to the source or emitter region 1041 and to a p-doped body region 111. An n-doped drift region 112 adjoins to a bottom side of the body region 111. A dielectric structure 116 lines sidewalls and a bottom side of the trenches 1071, 1072, and is further arranged on a first surface 115 of the semiconductor body 110. The dielectric structure may include one or more dielectric layers, e.g. oxide layers (e.g. silicate glass, deposited $SiO_2$, thermal $SiO_2$), nitride layers (e.g., $Si_3N_4$), high-k dielectric layers, low-k dielectric layers, dielectric spacers, or any combination thereof. Separate parts of the dielectric structure 116 may have different function, for example.

In the example illustrated in FIG. 2B, the second transistor cell unit 103 is based on a first trench 1271, as well as a first mesa region 1261. An n-doped source or emitter region 1241 is arranged in the first mesa region 1261. The first trench 1271 includes a gate electrode G2 that is electrically coupled to a gate pad. The first mesa region 1261 is electrically coupled to a groove contact GC2 in a wiring area over a first surface 115 the semiconductor body 110. The groove contact GC2 provides electric contact to the source or emitter region 1241 and to a p-doped body region 121. An n-doped drift region 122 adjoins to a bottom side of the body region 121. A dielectric structure 126 lines sidewalls and a bottom side of the trenches 1271, 1272, and is further arranged on the first surface 115 of the semiconductor body 110. The dielectric structure 126 may include one or more dielectric layers, e.g. oxide layers (e.g. silicate glass, deposited $SiO_2$, thermal $SiO_2$), nitride layers (e.g., $Si_3 N_4$), high-k dielectric layers, low-k dielectric layers, dielectric spacers, or any combination thereof. Separate parts of the dielectric layer may have different function, for example.

Similar elements in the first and second trench transistor cell units, e.g. the trenches 1071, 1072, 1271, 1272, or the source or emitter regions 1041, 1241, or the body regions 111, 121, or the drift regions 112, 122, or the groove contacts GC1, GC2, or the gate electrodes G1, G2, or the dielectric structures 116, 126, may be concurrently formed, for example.

The second trench transistor cell unit 103 is based on a single trench in the example illustrated in FIG. 2B. According to another example illustrated in the schematic cross-sectional view of FIG. 2C, the second trench transistor cell unit 103 may also be based on the first and a second trench 1272 similar to the first trench transistor cell unit 102 illustrated in FIG. 2A. The second trench 1272 includes a source electrode S2 that is electrically coupled to the second load terminal L1, e.g. the source or emitter terminal or electrode.

Figure 3A:
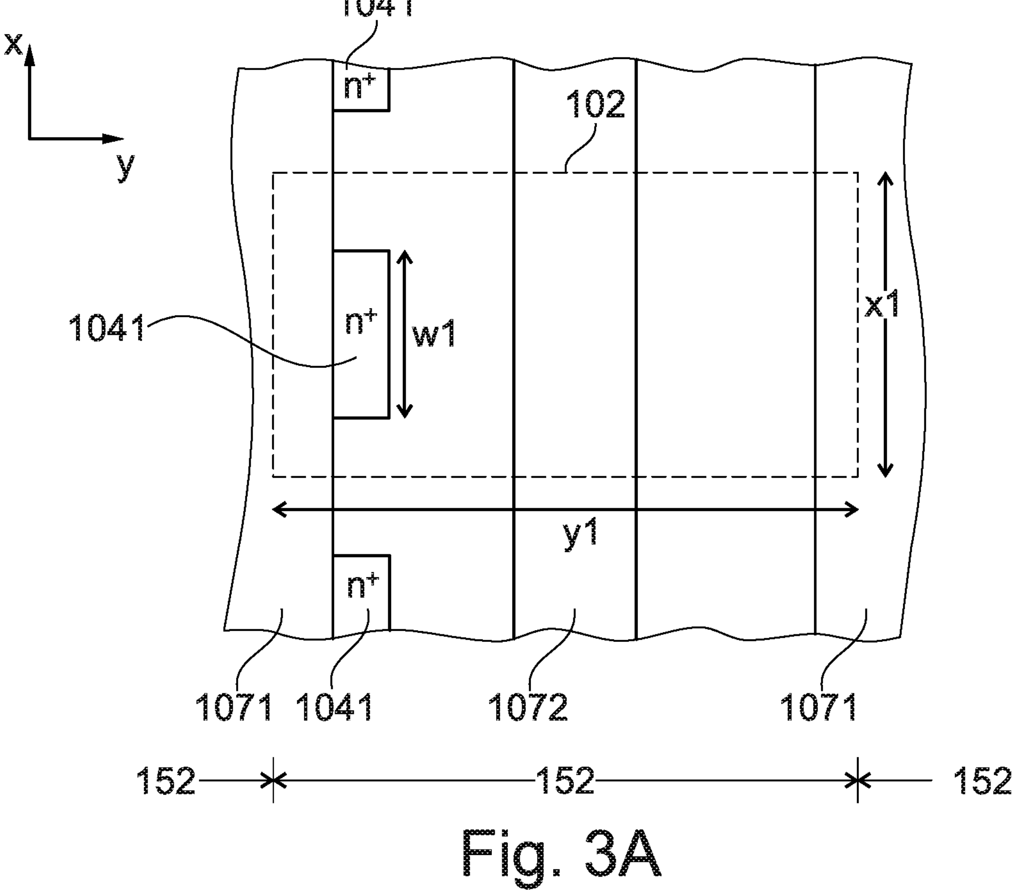
FIGS. 3A and 3B are schematic top views for illustrating examples of first and second trench transistor cell units.
Figure 3B:
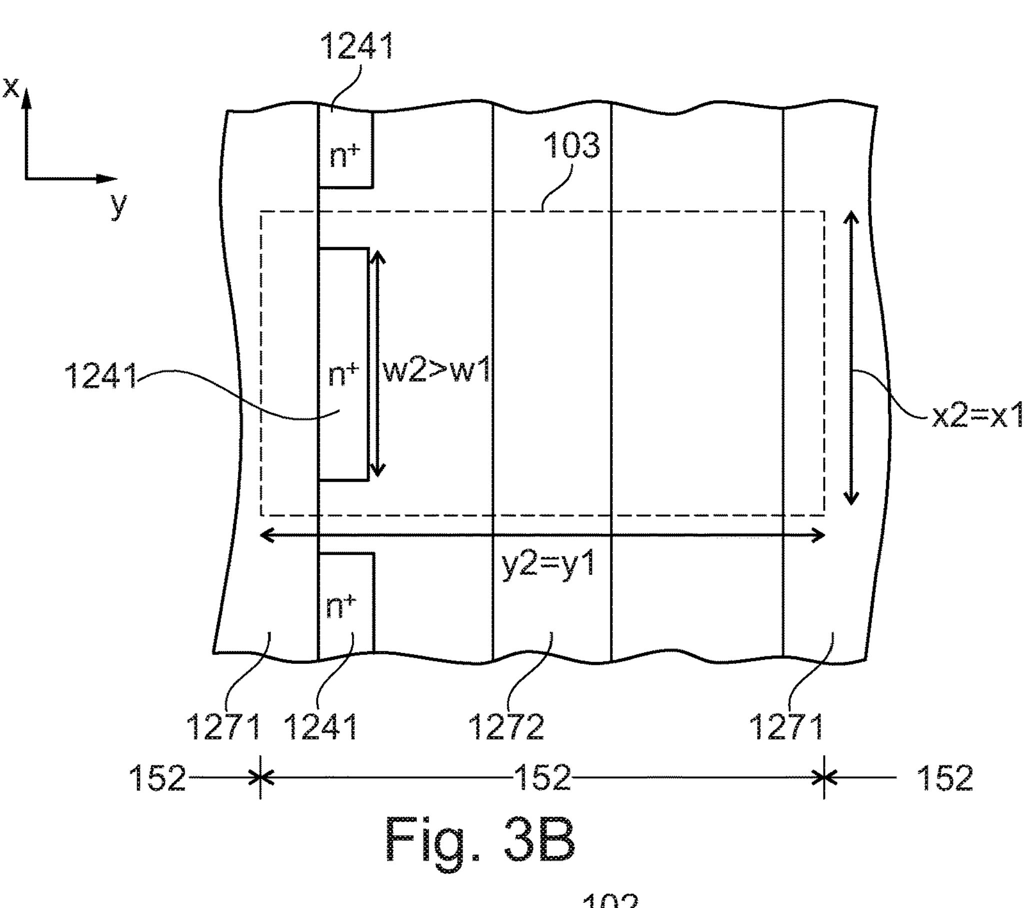

Referring to the schematic top views illustrated in FIGS. 3A and 3B, the transistor cell array includes stripe-shaped transistor sections 152 arranged parallel to each other, wherein each one of the stripe-shaped transistor sections 152 includes a plurality of transistor cell units arranged one after another along a direction x of extension of the stripe-shaped transistor sections 152.

In the examples illustrated in FIGS. 3A and 3B dimensions x1, y1 of the first trench transistor cell unit 102 along the lateral directions x, y equal dimensions x2, y2 of the second trench transistor cell unit 103, respectively, i.e. x1=x2, y1=y2. An extension of the source or emitter region 1041 of the first trench transistor cell unit 102 along the lateral direction x is set smaller than an extension of the source or emitter region 1241 of the second trench transistor cell unit 103 the lateral direction x. Thus, a channel width w1 of the first trench transistor cell unit 102 is set smaller than a channel width w2 of the second trench transistor cell unit 103, i.e. w1<w2.

Figure 4A:
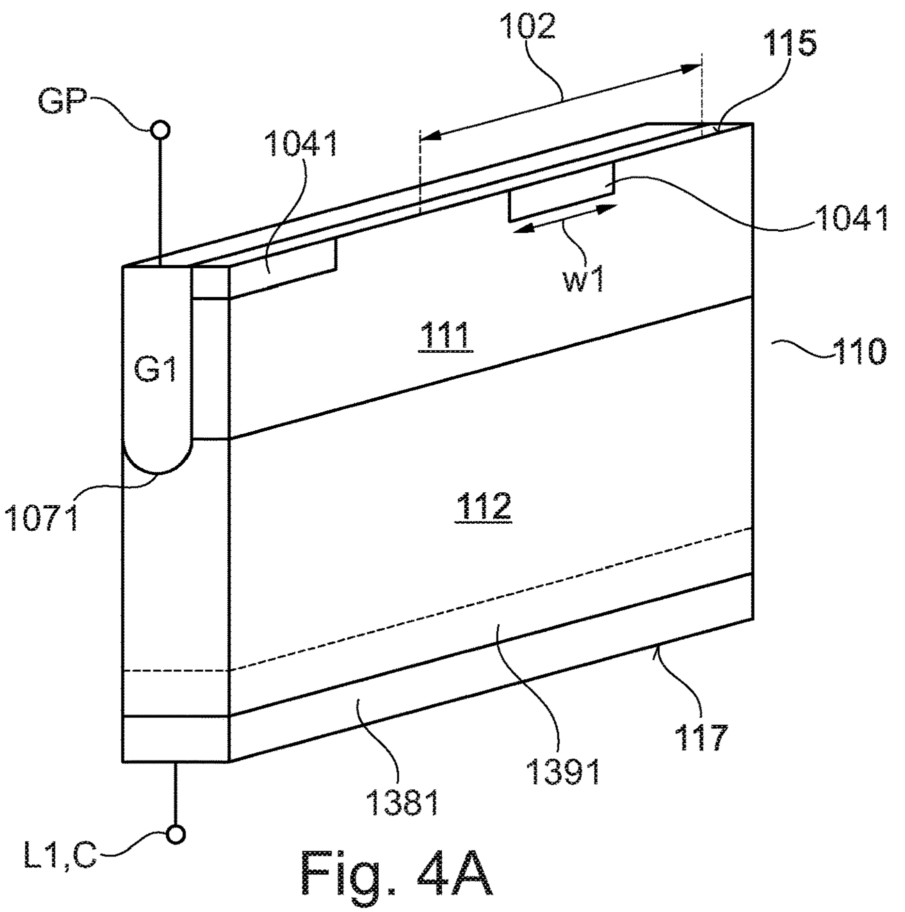
FIGS. 4A and 4B are schematic perspective views for illustrating examples of first and second trench transistor cell units.
Figure 4B:
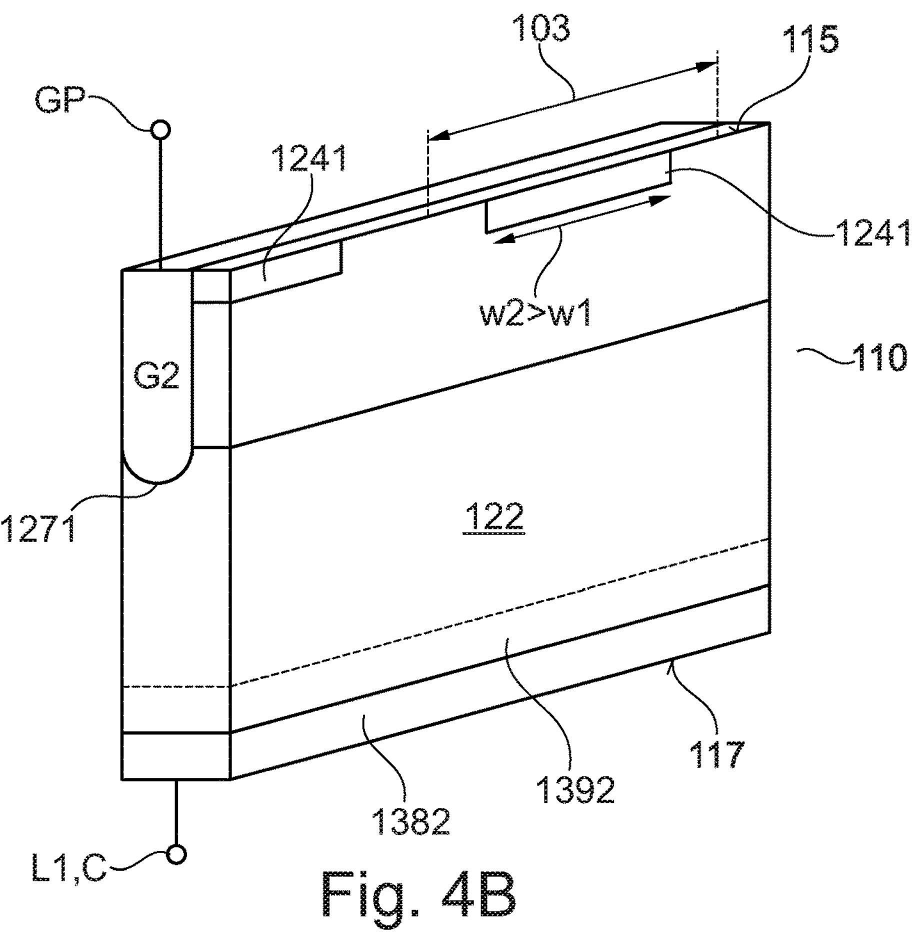

The illustrations in FIGS. 4A and 4B are perspective views of the first and second trench transistor cell units 102, 103 illustrated in FIGS. 3A and 3B, respectively. A gate pad GP is electrically connected to the gate electrode G1 (G2) in the first trench 1071 (1271) at the first surface 115 and a collector terminal C, e.g. a first load terminal L1, is electrically connected to a collector region 1381, 1382 at a second surface 117 opposite to the first surface 115. A field stop region 1391, 1392 may adjoin to the collector region 1381, 1382, respectively.

Figure 5A:
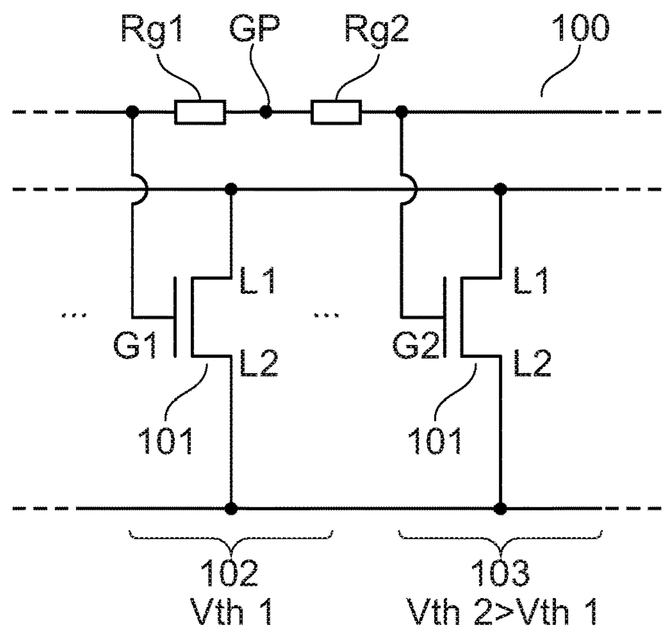
FIG. 5A is a schematic view for illustrating internal gate resistors electrically coupled between gate electrode and gate pad of the first and second trench transistor cell units, respectively.

Referring to the schematic view of FIG. 5A, a first internal gate resistor Rg1 is connected in series between the gate electrode G1 of the first trench transistor cell unit 102 and a gate pad GP, and a second internal gate resistor Rg2 is connected in series between the gate electrode G2 of the second trench transistor cell unit 103 and the same gate pad GP. Preferably, a single gate pad GP is connecting, via the respective internal gate resistor, both gate electrodes G1, G2. The first internal gate resistor Rg1 is smaller than the second internal gate resistor Rg2.

Figure 5B:
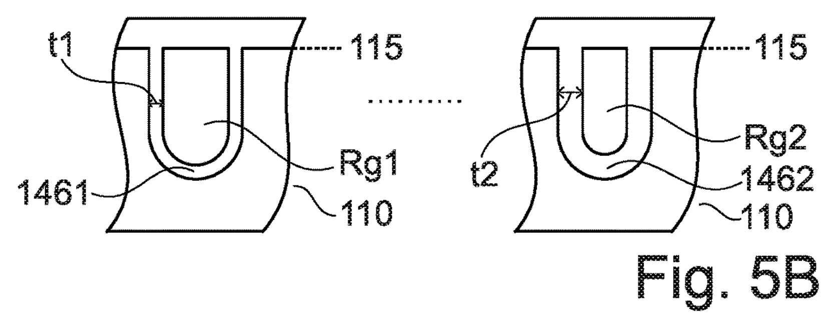
FIG. 5B is a schematic cross-sectional view for illustrating one example of implementing internal gate resistors of the first and second trench transistor cell units.

The schematic cross-sectional view of FIG. 5B illustrates an example of the first and second internal gate resistors Rg1, Rg2 being formed in trenches. In the example illustrated in FIG. 5B, the first internal gate resistor Rg1 and the second internal gate resistor Rg2 include conductive material, e.g. doped polycrystalline silicon. A cross section of the first internal gate resistor Rg1 is larger than a cross section of the second internal gate resistor Rg2 by setting a thickness t1 of a dielectric structure 1461 in a trench of the first internal gate resistor Rg1 smaller than a thickness t2 of a dielectric structure 1462 in a trench of the second internal gate resistor Rg1, i.e. t1<t2.

Figure 6A:
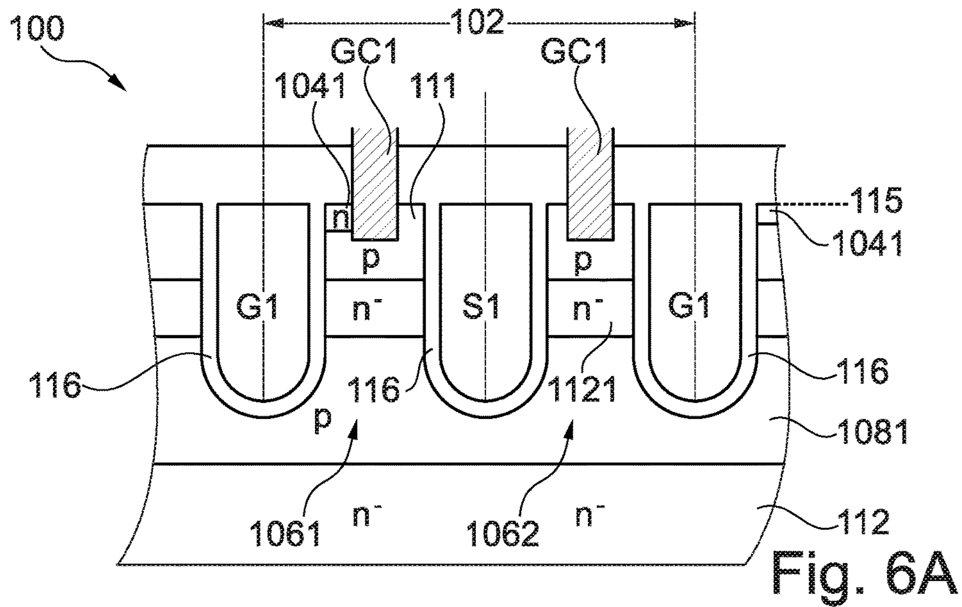
FIGS. 6A, 6B, 7A, and 7B are partial cross-sectional views for illustrating barrier regions in the first and/or second trench transistor cell units for tuning the turn-on behavior.

Another example of the first trench transistor cell unit 102 is illustrated in the schematic cross-sectional view of FIG. 6A. The first trench transistor cell unit 102 includes a p-doped first barrier region 1081. The first barrier region 1081 is arranged between the n-doped drift region 112 and the p-doped body region 111. The first barrier region 1081 may only be present in the first trench transistor cell unit 102. The first barrier region 1081 may be vertically confined by the drift region 112 and separated from the body region 111 by an n-doped semiconductor region 1121. For example, the n-doped semiconductor region 1121 and the drift region 112 may be similar with respect to a doping concentration and/or a doping material.

Figure 6B:
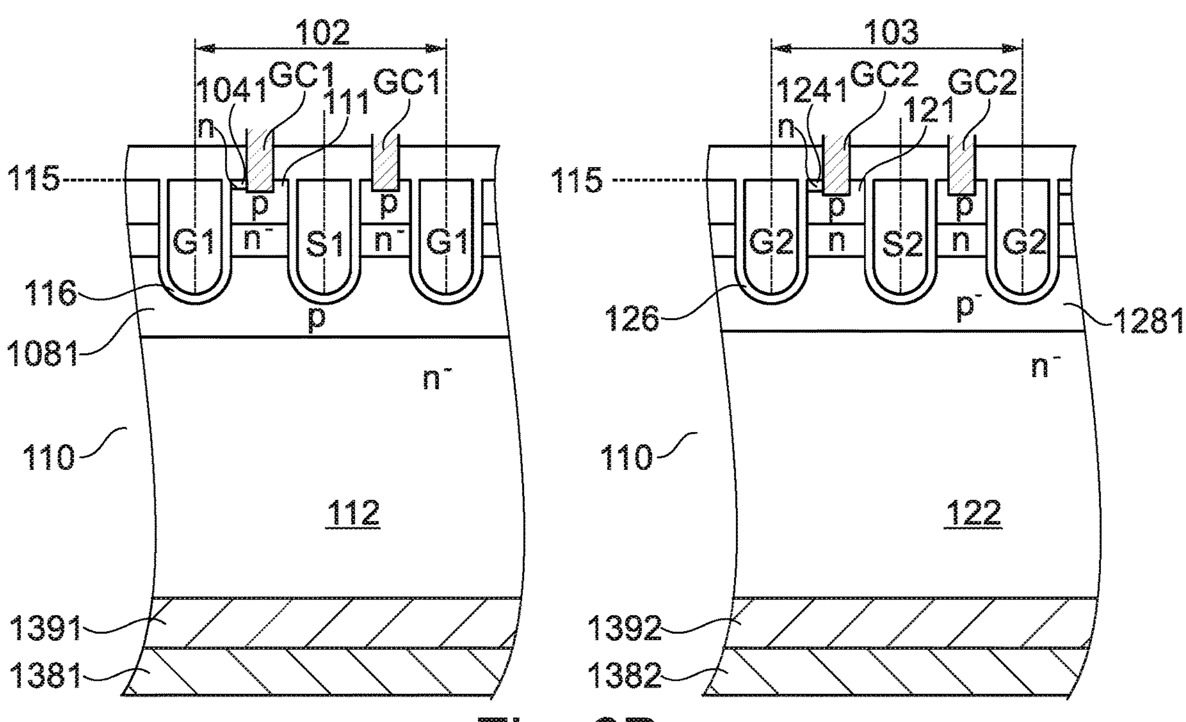

According to another example illustrated in the schematic cross-sectional view of FIG. 6B, a first barrier region 1281 may also be formed in the second trench transistor cell unit 103. The first barrier region 1081 in the first trench transistor cell unit 102 has a higher doping concentration than the first barrier region 1281 in the second trench transistor cell unit 103.

Figure 7A:
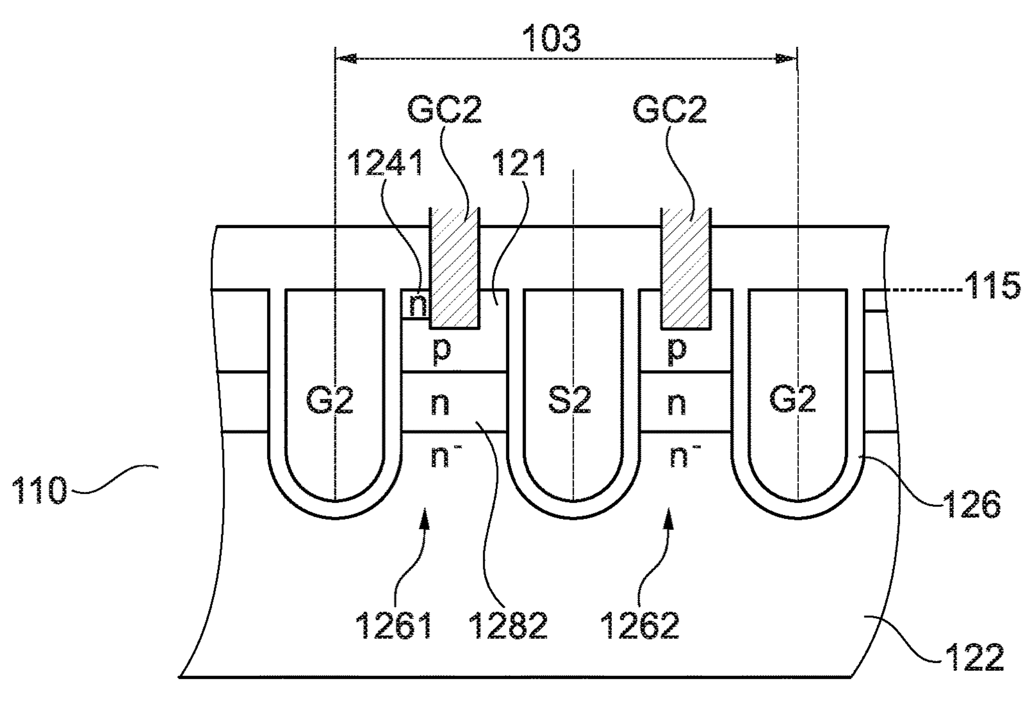

Another example of the second trench transistor cell unit 103 is illustrated in the schematic cross-sectional view of FIG. 7A. The second trench transistor cell unit 103 includes an n-doped second barrier region 1282. The second barrier region 1282 is arranged between the p-doped body region 121 and the n-doped drift region 122. A maximum doping concentration of the second barrier region 1282 is larger than a maximum doping concentration of the drift region part that adjoins a bottom side of the second barrier region 1282. The second barrier region 1282 may only be present in the second trench transistor cell unit 103.

According to another example (not depicted), a second barrier region 1282 may also be formed in the first trench transistor cell unit 102. The second barrier region 1082 in the second trench transistor cell unit 103 has a higher doping concentration than the second barrier region 1282 in the first trench transistor cell unit 102.

Figure 7B:
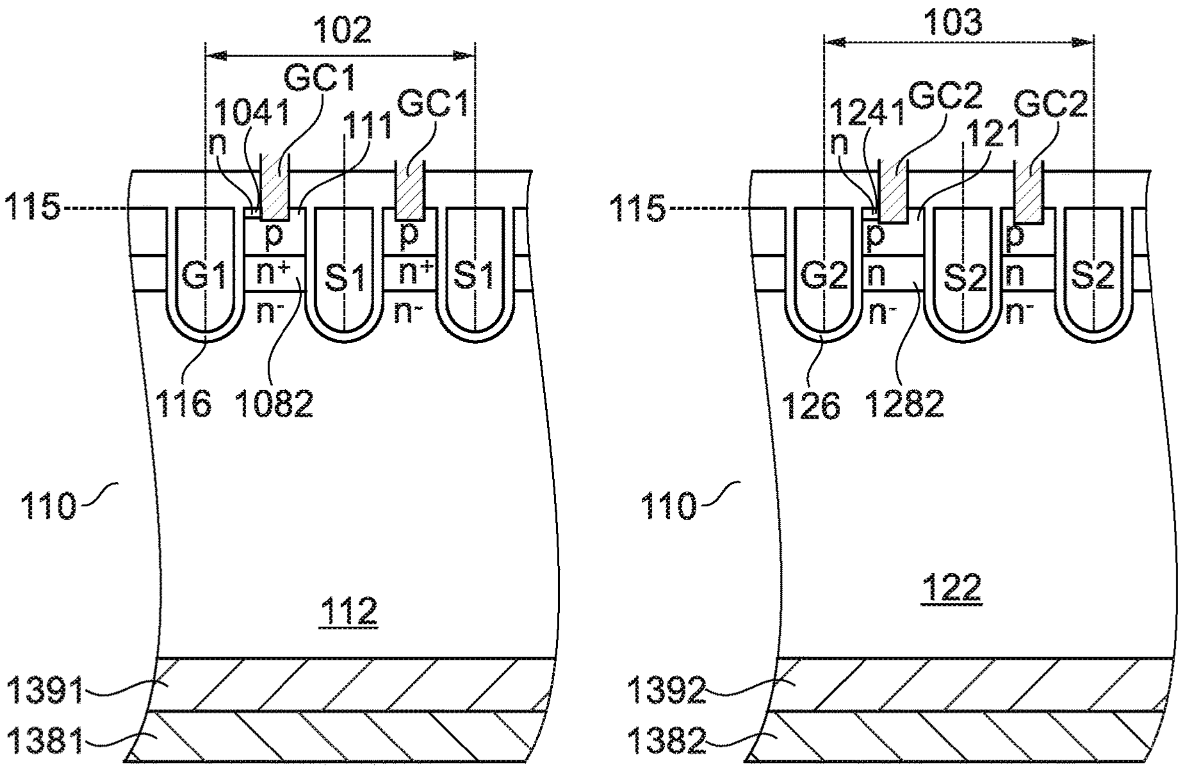

According to another example illustrated in the schematic cross-sectional view of FIG. 7B, a second barrier region 1082 may also be formed in the first trench transistor cell unit 102. The second barrier region 1082 in the first trench transistor cell unit 102 has a higher doping concentration than the second barrier region 1282 in the second trench transistor cell unit 103.

Figures 8A, 8B:
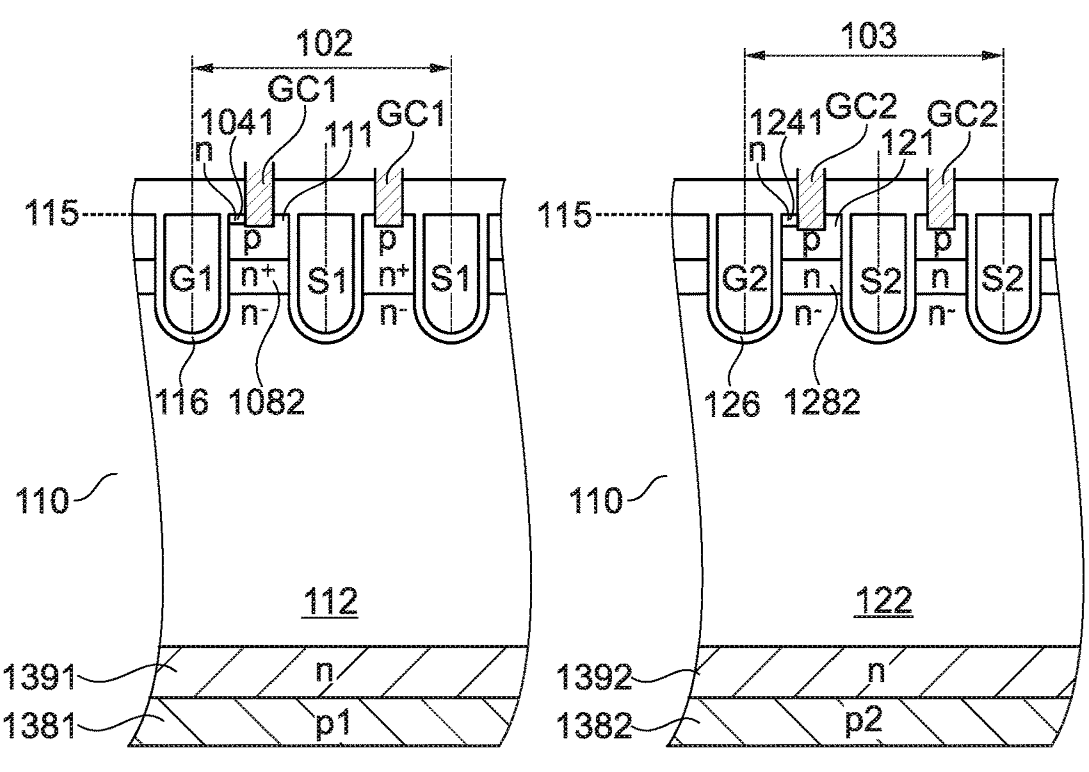
FIGS. 8A, 8B, 8C, and 8D are partial cross-sectional views for illustrating examples of first and second trench transistor cell units having different pnp transistor gains.

The schematic cross-sectional views of FIGS. 8A, 8B, 8C, and 8D exemplify examples of semiconductor devices 100 formed as n-channel IGBTs having a pnp transistor gain of the first trench transistor cell unit 102 being larger than the pnp transistor gain of the second trench transistor cell unit 103. Referring to FIG. 8A, the pnp transistor gain of the first trench transistor cell unit 102 may be set larger than the pnp transistor gain of the second trench transistor cell unit 103 by adjusting a doping concentration p1 in the collector region 1381 of the first trench transistor cell unit 102 larger than a doping concentration p2 in the collector region 1382 in the second trench transistor cell unit 103, i.e. p1>p2. Referring to FIG. 8B, the pnp transistor gain of the first trench transistor cell unit 102 may be set larger than the pnp transistor gain of the second trench transistor cell unit 103 by adjusting a doping concentration n1 of the field stop region 1391 of the first trench transistor cell unit 102 smaller than a doping concentration n2 of the field stop region 1392 of the second trench transistor cell unit 103, n1<n2.

Figure 8C:
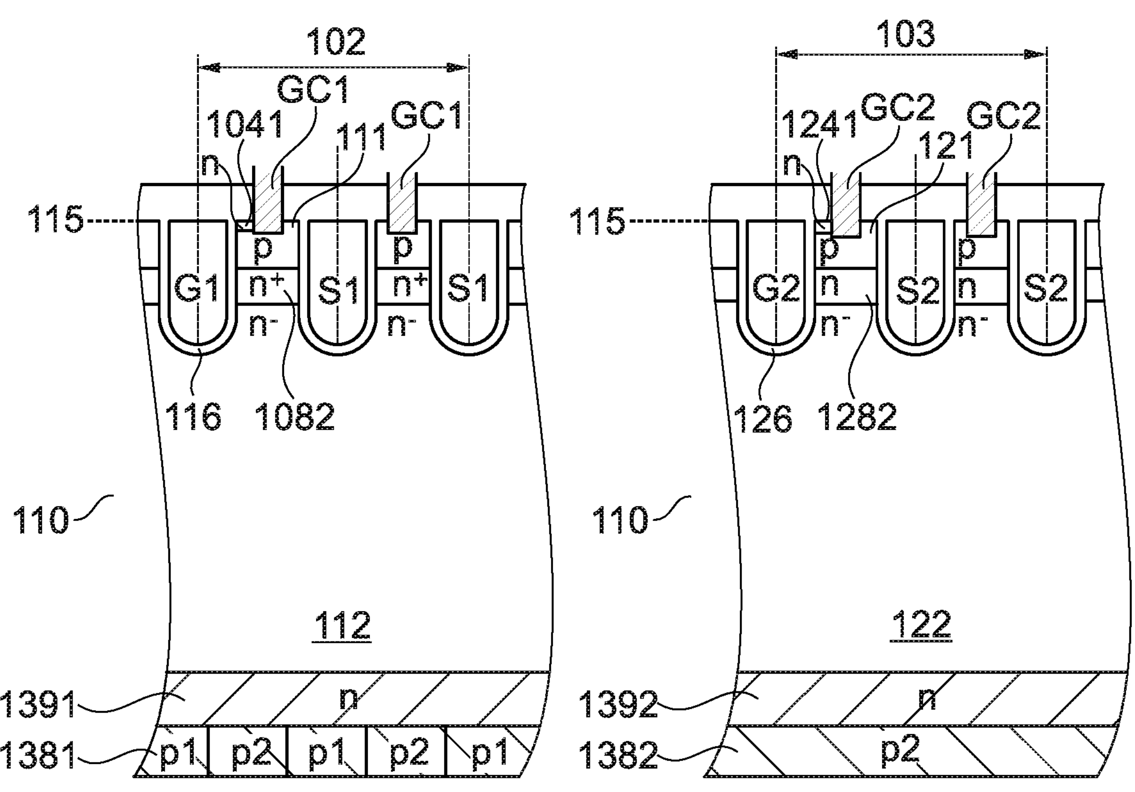

Referring to FIG. 8C, the pnp transistor gain of the first trench transistor cell unit 102 may be set larger than the pnp transistor gain of the second trench transistor cell unit 103 by sub-dividing the collector region 1381 into parts having different doping concentration p1, p2, p1>p2, and setting a doping concentration of the collector region 1382 of the second trench transistor cell unit 103 to the lower value p2. In another example (not depicted), the average or effective concentration of the collector region 1382 within the second trench transistor cell unit 103 may be lowered compared to the the average or effective concentration of the collector region 1381 within the first trench transistor cell unit 102 by sub-dividing the collector region 1382 into parts having different doping concentration p2, p3, p2>p3. Both measures can also be combined. In another example, both collector regions 1381, 1382 may comprise a different dopant concentration that is consistent within the respective collector region 1381, 1382. In general, an average or effective concentration of the collector region 1382 within the second trench transistor cell unit 103 may be smaller than the average or effective concentration of the collector region 1381 within the first trench transistor cell unit 102.

Figure 8D:
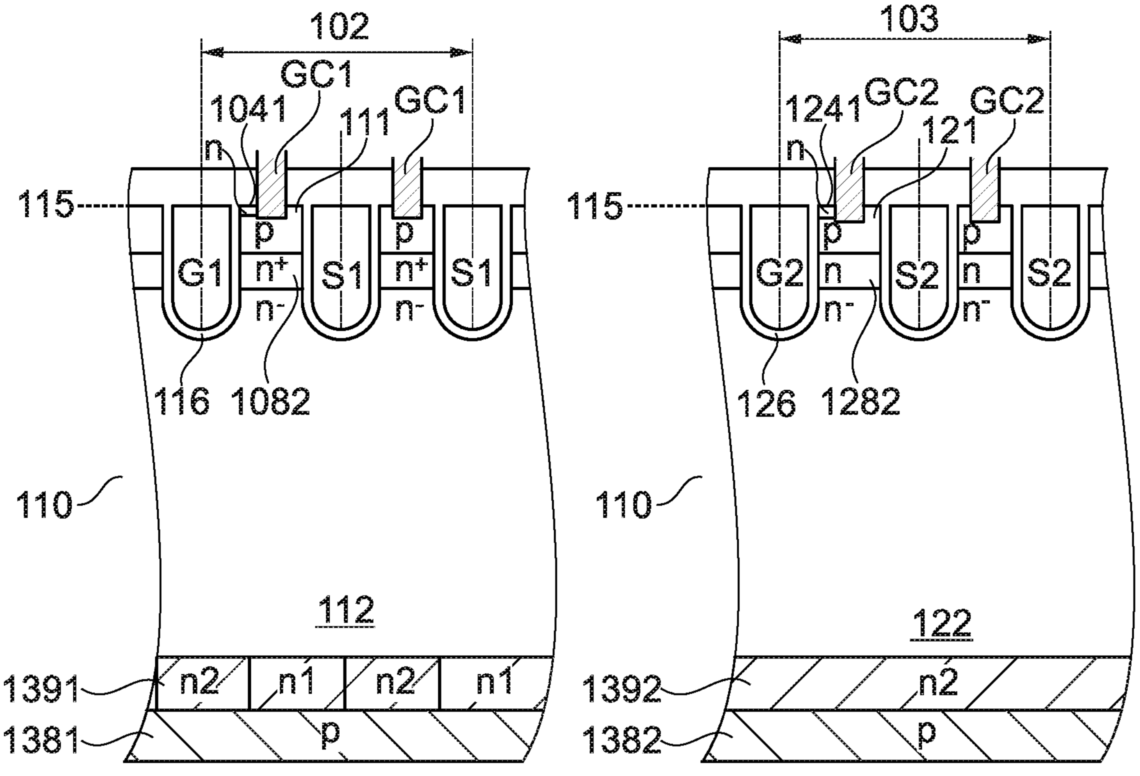

Referring to FIG. 8D, the pnp transistor gain of the first trench transistor cell unit 102 may be set larger than the pnp transistor gain of the second trench transistor cell unit 103 by sub-dividing the field stop region 1391 into parts having different doping concentration n1, n2, n1<n2, and setting a doping concentration of the collector region 1392 of the second trench transistor cell unit 103 to the larger value n2. Variations of the collector region and field stop region design may be combined.

The schematic view of FIG. 9 illustrates an exemplary trench transistor cell array that further comprises a third trench transistor cell unit 109 having a third threshold voltage larger than the second threshold voltage Vth2. The third trench transistor cell 109 unit has a larger share of an active area of the trench transistor cell array than the second trench transistor cell unit 103. The second trench transistor cell unit 103 has a larger share of an active area of the trench transistor cell array than the first trench transistor cell unit 102.

The schematic graph of FIG. 10 illustrates simulation results of the collector current Ic versus the gate-to-emitter voltage VGE for an IGBT having the first trench transistor cell unit 102 in 10% of the active area and the second trench transistor cell unit 103 in 90% of the active area. For small collector currents Ic, only the first trench transistor cell unit first 102 cell is active, and conducts most of the current, while for larger currents also the second trench transistor cell units 103 conduct a large amount of the current. This allows for a rather independent dU/dt and dI/dt of the turn-on current, thereby leading to a substantial speeding up of the IGBT at nominal currents.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

In the following some more embodiments are described:

Embodiment 1: A semiconductor device (100), comprising: a semiconductor body (110) comprising a trench transistor cell array, wherein the trench transistor cell array comprises a first trench transistor cell unit (102), and a second trench transistor cell unit (103), wherein transistor cells (101) based on the first trench transistor cell unit (102) and transistor cells (101) based on the second trench transistor cell unit (103) are electrically connected in parallel; a first internal gate resistor (Rg1) connected in series between a gate electrode (G1) of the first trench transistor cell unit (102) and a gate pad (GP); and a second internal gate resistor (Rg2) connected in series between the gate electrode (G2) of the second trench transistor cell unit (103) and the gate pad (GP), wherein the first internal gate resistor (Rg1) is smaller than the second internal gate resistor (Rg2); and wherein an absolute value of dU/dt at turning on a nominal current of the transistor cell array is at least 50% of a dU/dt at turning on 10% of the nominal current of the transistor cell array, dU/dt being the temporal derivate of a voltage U between load terminals (L1, L2) of the trench transistor cell array.

Embodiment 2: The semiconductor device (100) of embodiment 1, wherein the first internal gate resistor (Rg1) and the second internal gate resistor (Rg2) include doped polycrystalline silicon, and a cross section of the first internal gate resistor (Rg1) is larger than a cross section of the second internal gate resistor (Rg2).

Embodiment 3: The semiconductor device (100) of one embodiment 1 or 2, wherein a share of a source or emitter region (1041) within the first trench transistor cell unit (102) is smaller than a share of a source or emitter region (1241) within the second trench transistor cell unit (103).

Embodiment 4: The semiconductor device (100) of the preceding embodiment 3, wherein at least the first trench transistor cell unit (102) includes a first mesa region (1061) and a second mesa region (1062), and the source or emitter region (1041) is arranged in the first mesa region (1061) and is omitted from the second mesa region (1062), wherein a ratio of first mesa regions (1061, 1261) to second mesa regions (1062, 1262) is greater in the first trench transistor cell unit (102) than in the second trench transistor cell unit (103).

Embodiment 5: The semiconductor device (100) of any of the two preceding embodiments 3 or 4, wherein at least the first trench transistor cell unit (102) includes a first mesa region (1061) and a second mesa region (1062), and the second mesa region (1062) is laterally confined by trench electrode structures having a trench electrode that is electrically disconnected from a gate electrode (G1).

Embodiment 6: The semiconductor device (100) of the preceding embodiment 5, wherein the second mesa region (1062) is electrically connected to a source or emitter electrode (L2) over the second mesa region (1062).

Embodiment 7: The semiconductor device (100) of any of the two preceding embodiments 5 or 6, wherein the trench electrode structures are electrically connected to a source or emitter electrode (L2).

Embodiment 8: The semiconductor device (100) of the preceding embodiment 7, wherein a gate electrode (G1) of the first trench transistor cell unit (102) has a larger cell unit active area share than a gate electrode (G2) of the second trench transistor cell unit (103).

Embodiment 9: The semiconductor device (100) of any of the preceding embodiments 1 to 8, wherein the first trench transistor cell unit (102) comprises a first barrier region (1081) having a first conductivity type different from a second conductivity type, the first barrier region (1081) being arranged between a drift region (112) of the second conductivity type and a body region (111) of the first conductivity type.

Embodiment 10: The semiconductor device (100) of the preceding embodiment 9, wherein the first barrier region (1081) is only present in the first trench transistor cell unit (102) or comprises a higher doping concentration than in the second trench transistor cell unit (103).

Embodiment 11: The semiconductor device (100) of any of the two preceding embodiments 9 or 10, wherein the first barrier region (1081) is vertically confined by the drift region (112) and separated from the body region (111) by at least one other semiconductor region (1121).

Embodiment 12: The semiconductor device (100) of any of the preceding embodiments 1 to 11, wherein the second trench transistor cell unit (103) comprises a second barrier region (1282) having a second conductivity type different from a first conductivity type, the second barrier region (1282) being arranged between a body region (121) of the first conductivity type and a drift region (122) of the second conductivity type, wherein a maximum doping concentration of the second barrier region (1282) is larger than a maximum doping concentration of a drift region part that adjoins a bottom side of the second barrier region (1282).

Embodiment 13: The semiconductor device (100) of the preceding embodiment 12, wherein the second barrier region (1081) is only present in the second trench transistor cell unit (102) or comprises a higher doping concentration than in the first trench transistor cell unit (103).

Embodiment 14: The semiconductor device (100) of any of the preceding embodiments 1 to 13, wherein a channel width (w1) per area of the first trench transistor cell unit (102) is smaller than a channel width (w2) per area of the second trench transistor cell unit (103).

Embodiment 15: The semiconductor device (100) of any of the preceding embodiments 1 to 14, wherein the second trench transistor cell unit (103) differs from the first trench transistor cell unit (102) by a laterally patterned collector region (1381, 1382).

Embodiment 16: The semiconductor device (100) of any of the preceding embodiments 1 to 15, wherein the first trench transistor cell unit (102) has a 5% to 20% share of an active area of the trench transistor cell array.

Embodiment 17: The semiconductor device (100) of any of the preceding embodiments 1 to 16, wherein the trench transistor cell array further comprises a third trench transistor cell unit (109) and a third internal gate resistor (Rg3) connected in series between a gate electrode (G3) of the third trench transistor cell unit (109) and the gate pad (GP); and wherein the third trench transistor cell unit (109) has a larger share of an active area of the trench transistor cell array than the second transistor cell unit (103), and the second trench transistor cell unit (103) has a larger share of an active area of the trench transistor cell array than the first trench transistor cell unit (102).

Embodiment 18: The semiconductor device (100) of any of the preceding embodiments 1 to 17, wherein the semiconductor device (100) is an n-channel IGBT, and the pnp transistor gain of the first trench transistor cell unit (102) is larger than the pnp transistor gain of the second trench transistor cell unit (103).

What is claimed is:

1. A semiconductor device, comprising:

a semiconductor body comprising a trench transistor cell array, wherein the trench transistor cell array comprises a first trench transistor cell unit and a second trench transistor cell unit, wherein transistor cells based on the first trench transistor cell unit and transistor cells based on the second trench transistor cell unit are electrically connected in parallel, wherein the first trench transistor cell unit has a first threshold voltage;

wherein the second trench transistor cell unit has a second threshold voltage larger than the first threshold voltage, wherein an absolute value of dU/dt at turning on a nominal current of the transistor cell array is at least 50% of a dU/dt at turning on 10% of the nominal current of the transistor cell array, dU/dt being the temporal derivate of a voltage U between load terminals of the trench transistor cell array.

2. The semiconductor device of claim 1, wherein a first internal gate resistor is connected in series between a gate electrode of the first trench transistor cell unit and a gate pad, wherein a second internal gate resistor is connected in series between a gate electrode of the second trench transistor cell unit and the gate pad, and wherein the first internal gate resistor is smaller than the second internal gate resistor.

3. The semiconductor device of claim 2, wherein the first internal gate resistor and the second internal gate resistor include doped polycrystalline silicon, and wherein a cross section of the first internal gate resistor is larger than a cross section of the second internal gate resistor.

4. The semiconductor device of claim 1, wherein a share of a source or emitter region within the first trench transistor cell unit is smaller than a share of a source or emitter region within the second trench transistor cell unit.

5. The semiconductor device of claim 4, wherein at least the first trench transistor cell unit includes a first mesa region and a second mesa region, wherein the source or emitter region is arranged in the first mesa region and is omitted from the second mesa region, and wherein a ratio of first mesa regions to second mesa regions is greater in the first trench transistor cell unit than in the second trench transistor cell unit.

6. The semiconductor device of claim 4, wherein at least the first trench transistor cell unit includes a first mesa region and a second mesa region, and wherein the second mesa region is laterally confined by trench electrode structures having a trench electrode that is electrically disconnected from a gate electrode.

7. The semiconductor device of claim 6, wherein the second mesa region is electrically connected to a source or emitter electrode over the second mesa region.

8. The semiconductor device of claim 6, wherein the trench electrode structures are electrically connected to a source or emitter electrode.

9. The semiconductor device of claim 8, wherein a gate electrode of the first trench transistor cell unit has a larger cell unit active area share than a gate electrode of the second trench transistor cell unit.

10. The semiconductor device of claim 1, wherein the first trench transistor cell unit comprises a first barrier region having a first conductivity type different from a second conductivity type, the first barrier region being arranged between a drift region of the second conductivity type and a body region of the first conductivity type.

11. The semiconductor device of claim 10, wherein the first barrier region is only present in the first trench transistor cell unit or comprises a higher doping concentration than in the second trench transistor cell unit.

12. The semiconductor device of claim 10, wherein the first barrier region is vertically confined by the drift region and separated from the body region by at least one other semiconductor region.

13. The semiconductor device of claim 1, wherein the second trench transistor cell unit comprises a second barrier region having a second conductivity type different from a first conductivity type, the second barrier region being arranged between a body region of the first conductivity type and a drift region of the second conductivity type, and wherein a maximum doping concentration of the second barrier region is larger than a maximum doping concentration of a drift region part that adjoins a bottom side of the second barrier region.

14. The semiconductor device of claim 13, wherein the second barrier region is only present in the second trench transistor cell unit or comprises a higher doping concentration than in the first trench transistor cell unit.

15. The semiconductor device of claim 1, wherein a channel width per area of the first trench transistor cell unit is smaller than a channel width per area of the second trench transistor cell unit.

16. The semiconductor device of claim 1, wherein the second trench transistor cell unit differs from the first trench transistor cell unit by a laterally patterned collector region.

17. The semiconductor device of claim 1, wherein the first trench transistor cell unit has a 5% to 20% share of an active area of the trench transistor cell array.

18. The semiconductor device of claim 1, wherein the trench transistor cell array further comprises a third trench transistor cell unit having a third threshold voltage larger than the second threshold voltage, wherein the third trench transistor cell unit has a larger share of an active area of the trench transistor cell array than the second transistor cell unit, and wherein the second trench transistor cell unit has a larger share of an active area of the trench transistor cell array than the first trench transistor cell unit.

19. The semiconductor device of claim 1, wherein the semiconductor device is an n-channel IGBT, and a pnp transistor gain of the first trench transistor cell unit is larger than a pnp transistor gain of the second trench transistor cell unit.

20. A semiconductor device, comprising:

a semiconductor body comprising a trench transistor cell array, wherein the trench transistor cell array comprises a first trench transistor cell unit and a second trench transistor cell unit, wherein transistor cells based on the first trench transistor cell unit and transistor cells based on the second trench transistor cell unit are electrically connected in parallel;

a first internal gate resistor connected in series between a gate electrode of the first trench transistor cell unit and a gate pad; and a second internal gate resistor connected in series between the gate electrode of the second trench transistor cell unit and the gate pad, wherein the first internal gate resistor is smaller than the second internal gate resistor, wherein an absolute value of dU/dt at turning on a nominal current of the transistor cell array is at least 50% of a dU/dt at turning on 10% of the nominal current of the transistor cell array, dU/dt being the temporal derivate of a voltage U between load terminals (L1, L2) of the trench transistor cell array.

21. A method for manufacturing a semiconductor device, the method comprising:

forming a trench transistor cell array in a semiconductor body, wherein the trench transistor cell array comprises a first trench transistor cell unit and a second trench transistor cell unit; and electrically connecting in parallel transistor cells based on the first trench transistor cell unit and transistor cells based on the second trench transistor cell unit, wherein the first trench transistor cell unit has a first threshold voltage, wherein the second trench transistor cell unit has a second threshold voltage larger than the first threshold voltage, wherein an absolute value of dU/dt at turning on a nominal current of the transistor cell array is at least 50% of an absolute value of dU/dt at turning on 10% of the nominal current of the transistor cell array, dU/dt being the temporal derivate of a voltage U between load terminals of the trench transistor cell array.

* * * * *